US007009326B1

(12) United States Patent
Matsuo et al.

(10) Patent No.: US 7,009,326 B1
(45) Date of Patent: Mar. 7, 2006

(54) ULTRASONIC VIBRATION APPARATUS USE AS A SENSOR HAVING A PIEZOELECTRIC ELEMENT MOUNTED IN A CYLINDRICAL CASING AND GROOVES FILLED WITH FLEXIBLE FILLER

(75) Inventors: Kenji Matsuo, Kanazawa (JP); Junshi Ota, Ishikawa-gun (JP)

(73) Assignee: Murata Manufacturing Co., Ltd., (JP)

( * ) Notice: Subject to any disclaimer, the term of this patent is extended or adjusted under 35 U.S.C. 154(b) by 0 days.

(21) Appl. No.: 09/699,670

(22) Filed: Oct. 30, 2000

(30) Foreign Application Priority Data

Oct. 28, 1999 (JP) ................................ 11-307558
Mar. 7, 2000 (JP) ................................ 2000-61955

(51) Int. Cl.
*H01L 41/04* (2006.01)
*H01L 41/08* (2006.01)
*H01L 41/18* (2006.01)
*H02N 2/00* (2006.01)

(52) U.S. Cl. ...................... 310/324; 310/369; 310/348; 310/326; 310/327; 310/333

(58) Field of Classification Search ................ 310/324, 310/328, 369, 348, 323.05, 326, 327, 349, 310/333
See application file for complete search history.

(56) References Cited

U.S. PATENT DOCUMENTS 3,697,789 A * 10/1972 Kato et al. .................... 310/9.5
3,761,956 A * 9/1973 Takahashi et al. .......... 310/324
3,860,838 A * 1/1975 Kumon ....................... 310/322
3,872,470 A * 3/1975 Hoerz et al. ........... 340/384.72
3,970,879 A * 7/1976 Kumon ....................... 310/324
4,188,612 A * 2/1980 Kerr .......................... 367/160
4,683,396 A * 7/1987 Takeuchi et al. ............ 310/358
4,823,041 A * 4/1989 Inoue et al. ................ 310/322
4,860,442 A * 8/1989 Ainsworth et al. .......... 29/8.32
4,918,672 A * 4/1990 Iwabuchi et al. ............. 367/99
5,008,581 A * 4/1991 Kumada et al. ............ 310/323
5,032,753 A * 7/1991 Yamaguchi et al. ........ 310/317
5,051,647 A * 9/1991 Uchikawa et al. .......... 310/323
5,056,069 A * 10/1991 Granz et al. ................ 367/164
5,245,734 A * 9/1993 Issartel ....................... 29/25.35
5,297,553 A * 3/1994 Sliwa, Jr. et al. ....... 128/662.03
5,446,332 A * 8/1995 Rapps et al. ................ 310/324

(Continued)

FOREIGN PATENT DOCUMENTS

EP 0 678 853 10/1995

(Continued)

OTHER PUBLICATIONS

Patent Abstracts of Japan vol. 1998, No. 02 JP 09 284896.

(Continued)

*Primary Examiner*—Darren Schuberg
*Assistant Examiner*—Julio Gonzalez Ramirez
(74) *Attorney, Agent, or Firm*—Ostrolenk, Faber, Gerb & Soffen, LLP

(57) ABSTRACT

An ultrasonic vibration apparatus includes a casing having a vibration face, a piezoelectric element mounted in the casing, and a disk-like vibration plate supported at a position along a concentric circle differentiating two regions, an inner region and an outer region. In the ultrasonic vibration apparatus, the disk-like vibration plate is constructed so as to be a part of the casing serving as the vibration face, and, the piezoelectric element is mounted in the central part of the disk-like vibration plate, thereby causing the inner region and the outer region to vibrate in substantially the same phase.

16 Claims, 8 Drawing Sheets

U.S. PATENT DOCUMENTS

| | | | | | |
|---|---|---|---|---|---|
| 5,495,137 | A | * | 2/1996 | Park et al. | 310/331 |
| 5,636,182 | A | * | 6/1997 | Suzuki et al. | 367/165 |
| 5,648,942 | A | * | 7/1997 | Kunkel, III | 367/176 |
| 5,659,220 | A | * | 8/1997 | Thurn et al. | 310/322 |
| 5,852,337 | A | * | 12/1998 | Takeuchi et al. | 310/328 |
| 5,955,821 | A | * | 9/1999 | Yamamoto et al. | 310/321 |
| 5,983,471 | A | * | 11/1999 | Osawa | 29/25.35 |
| 6,025,209 | A | * | 2/2000 | Wuu et al. | 438/53 |
| 6,107,722 | A | * | 8/2000 | Thurn | 310/322 |
| 6,140,740 | A | * | 10/2000 | Porat et al. | 310/322 |
| 6,215,227 | B1 | * | 4/2001 | Boyd | 310/359 |
| 6,236,143 | B1 | * | 5/2001 | Lesieutre et al. | 310/331 |

FOREIGN PATENT DOCUMENTS

| | | | | | |
|---|---|---|---|---|---|
| JP | 401233493 | A | * | 9/1989 | |
| JP | 402051289 | A | * | 2/1990 | |
| JP | 08015416 | | | 1/1996 | |
| JP | 08237795 | | | 9/1996 | |
| JP | 09284896 | | | 10/1997 | |
| JP | 10257595 | | | 9/1998 | |
| WO | WO-9016087 | A | * | 6/1990 | 310/311 |
| WO | WO99/01234 | | | 1/1999 | |

OTHER PUBLICATIONS

Patent Abstracts of Japan vol. 1997, No. 01 Jan. 31, 1997 JP 08 237795.

Patent Abstracts of Japan vol. 1998, No. 14, Dec. 31, 1998 JP 10 257595.

Patent Abstracts of Japan vol. 1996, No. 05, May 31, 1996, JP 08 015416.

* cited by examiner

DIRECTIVITY CHARACTERISTICS

ULTRASONIC VIBRATION APPARATUS USE AS A SENSOR HAVING A PIEZOELECTRIC ELEMENT MOUNTED IN A CYLINDRICAL CASING AND GROOVES FILLED WITH FLEXIBLE FILLER

BACKGROUND OF THE INVENTION

1. Field of the Invention

The present invention relates to an ultrasonic vibration apparatus such as an ultrasonic sensor used for detecting an object by transmitting and receiving ultrasonic waves.

2. Description of the Related Art

Hitherto, as disclosed in, for example, Japanese Unexamined Patent Application Publication No. 8-15416, Japanese Unexamined Patent Application Publication No. 8-237795, Japanese Unexamined Patent Application Publication No. 9-284896, and Japanese Unexamined Patent Application Publication No. 10-257595, ultrasonic vibration apparatuses such as ultrasonic sensors employ a construction in which a piezoelectric element having an electrode formed on a piezoelectric plate is mounted in a casing.

Here, the basic construction of the ultrasonic vibration apparatus and an appearance of vibration thereof used for such conventional ultrasonic sensors are shown in FIGS. 9A and 9B. FIG. 9A is a cross sectional view showing a state in which a piezoelectric element 1 is mounted inside a casing 2. The casing 2 forms a cylindrical shape in which one end thereof serves as a disk-like vibration plate 2' and in which the piezoelectric element 1 is bonded on the inner face of the end. When driving voltage is applied to the piezoelectric element 1, the piezoelectric element 1 conducts a bending vibration at a predetermined resonance frequency. Similarly, the disk-like vibration plate 2' also conducts the bending vibration.

Thus, in the state in which the piezoelectric element 1 is bonded on the vibration plate, the resonance frequency depends on the material of the casing 2, the thickness a of the vibration plate 2', and the diameter b thereof.

In such conventional ultrasonic vibration apparatuses, the sizes of the vibration plate 2' influence not only the resonance frequency of but also the directivities of the ultrasonic waves at transmission time and at reception time. Generally, by widening the diameter of the vibration face and shortening the wavelength of the ultrasonic waves, directivity becomes narrowed. Accordingly, in an ultrasonic sensor in which narrow directivity is required, the outer diameter b of the casing is set to be large, further the thickness a is set to be great in order to set the resonance frequency to be high.

However, when the apparatus is used as an ultrasonic sensor, because of restriction in the size in the outer diameter and restriction of the wavelength to be used, the narrow directivity cannot be obtained without causing the apparatus to be large or without causing the operating frequency to be high.

Furthermore, the relationship that the directivity is determined by the area of the above-described vibration face and the wavelength is applied to, strictly speaking, a case in which the vibrating face is parallel-vibrating in a piston-movement manner and in which the ultrasonic wave is emitted as a plane wave. In the conventional ultrasonic apparatus in which the piezoelectric element is mounted in the cylindrical casing having simply one end thereof closed, since the vibration plate 2' performs the bending vibration as shown in FIG. 9B, the ultrasonic waves propagate through air as a spherical wave front. Therefore, there is a problem in that little advantage in obtaining a narrow directivity is achieved even though the vibrating area is widened or the wavelength of the ultrasonic waves is shortened.

FIG. 10 shows the result of computation by a finite-element method (FEM) which is applied to the appearance of deformation in a vibration plate (the casing) due to vibration in a conventional ultrasonic vibration apparatus as shown in FIGS. 9A and 9B. FIG. 11 shows the result obtained by computing directivity characteristics of the ultrasonic waves which are emitted by this deformation. In this example, an angle (directivity angle) required to cause the sound pressure to be decreased up to −6.0 [dB], that is, to cause the sound pressure to be halved, is as wide as 44 degrees.

SUMMARY OF THE INVENTION

Accordingly, objects of this invention are to provide a miniaturized ultrasonic vibration apparatus showing narrow directivity characteristics without causing the frequency to be increased.

To this end, there is provided an ultrasonic vibration apparatus which includes a casing having a vibration surface, a piezoelectric element mounted in the casing, and, a disk-like vibration plate supported at a position along a circle defining two regions, an inner region thereof and an outer region thereof. In the ultrasonic vibration apparatus, the disk-like vibration plate is constructed so as to be a part of the casing serving as the vibration face, and the piezoelectric element is mounted in the central part of the disk-like vibration plate, thereby causing the inner region and the outer region to vibrate in substantially the same phase.

This allows a sound wave due to vibration in the inner region of the disk-like vibration plate and a sound wave due to vibration in the outer region thereof to interfere in the space in front of the vibration face of the vibration plate. In a direction having the same phase, the energy of sound waves is enhanced. In a direction having the opposite phase, the energy of sound waves is offset. The position of the inner region of the vibration plate and that of the outer region thereof deviate in the direction of the plane of the vibration plate and they vibrate in the same phase. Therefore, a region having the same phase is generated in the direction along the center axis perpendicular to the vibration plate in front of the vibration face. In a diagonal direction deviating therefrom, a region having the two sound waves offset is generated. Accordingly, narrow directivity characteristics strongly directed toward the central axis can be obtained.

In the ultrasonic vibration apparatus, the casing may be constructed having a cylindrical shape with at least one end thereof closed and a groove is provided in an outer surface in proximity to the closed end of the casing thereby constituting the disk-like vibration plate.

This allows a part of the casing to serve as the disk-like vibrating plate. In addition, a structure for supporting at a position along a predetermined concentric circle can be easily constructed.

In the ultrasonic vibration apparatus, a flexible filler whose hardness is lower than that of the casing may be filled in the groove.

This allows reverberation characteristics due to vibration in, particularly, the outer region of the vibration plate, to be improved.

In the ultrasonic vibration apparatus, the ultrasonic vibration apparatus may be used for an ultrasonic sensor.

DESCRIPTION OF THE PREFERRED EMBODIMENTS

The construction of an ultrasonic vibration apparatus as an ultrasonic sensor according to a first embodiment of this invention is described with reference to FIGS. 1 to 4.

Figure 1A:
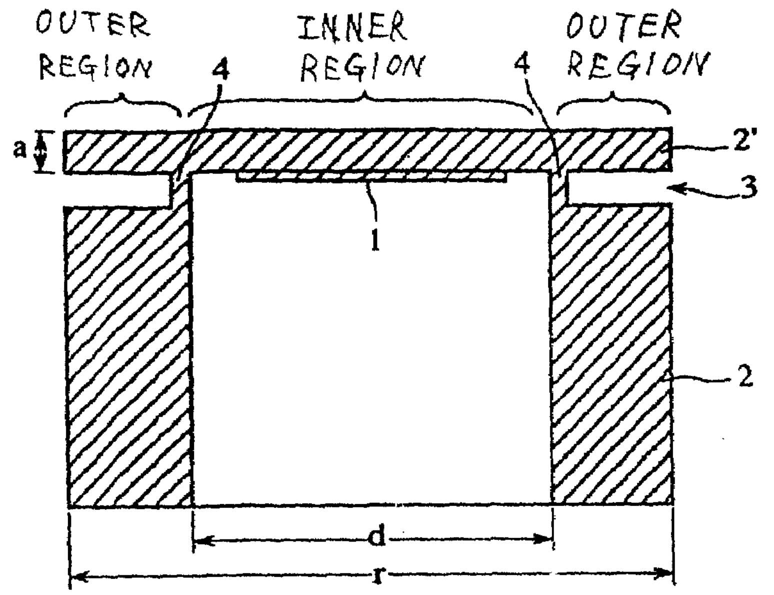
FIGS. 1A, 1B, and 1C are diagrams showing the construction of an ultrasonic vibration apparatus according to a first embodiment.
Figure 1B:
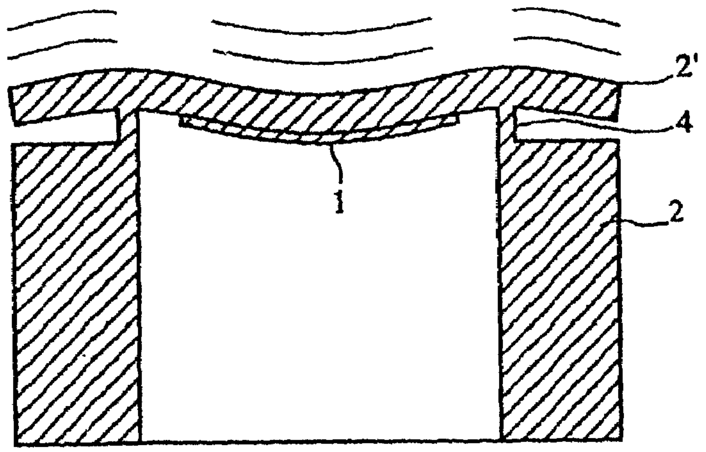
Figure 1C:
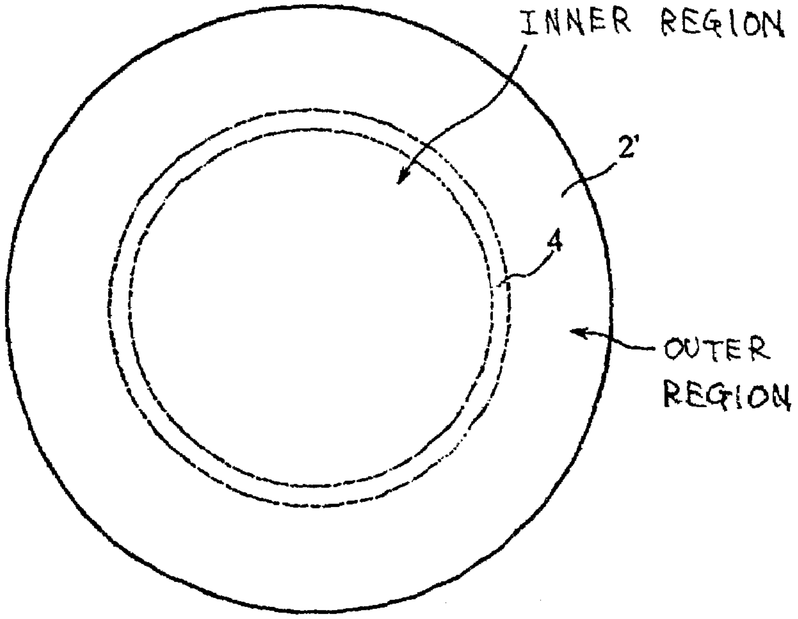

FIGS. 1A, 1B, and 1*c* are cross sectional and top plan views showing the construction of the ultrasonic vibration apparatus. As shown in FIG. 1A, a casing 2 forms a cylindrical shape having one end thereof closed and is molded by die casting or cutting of aluminum. The closed end of this casing 2 is formed in which, by providing a groove 3 in the outer surface of the casing which is in proximity to the closed end, the thickness in the emitting direction of the outer peripheral surface of the casing which is in proximity to the closed end is reduced, thereby this closed overall end constitutes the disk-like vibration plate 2'. At the same time, the above part having the thickness thereof reduced constitutes a supporting unit 4 for supporting the disk-like vibration plate 2'.

As shown in FIG. 1C, in the above supporting unit 4, the disk-like vibration plate 2' is divided into an inner region which is inside the supporting unit and an outer region which is outside the supporting unit. The disk-like piezoelectric element 1 is bonded in the central part of this disk-like vibration plate 2'. This piezoelectric element 1 is obtained by providing electrodes on both principal surfaces of the disk-like piezoelectric plate. By applying alternating voltage across the both electrodes, the piezoelectric element 1 conducts bending vibration.

FIG. 1B shows a state in which the disk-like vibration plate 2' is deformed when vibrating due to piezoelectric vibration of the piezoelectric element 1. As a consequence of bending vibration of the piezoelectric element 1, the disk-like vibration plate 2' also conducts bending vibration in which the supporting unit 4 serves as a node of vibration and in which the central part of the inner region and the outer peripheral portion of the outer region serve as antinodes.

Here, the dimensions of the casing 2 are as follows: d=9.4 mm, r=16.0 mm, and a=1.0 mm.

The diameter of the piezoelectric element 1 is 7.0 mm and the thickness thereof is 0.15 mm. In this example, resonance occurs at 80 kHz, and the inner region of the disk-like vibration plate 2' and the outer region thereof resonate in the same phase.

Figure 2:
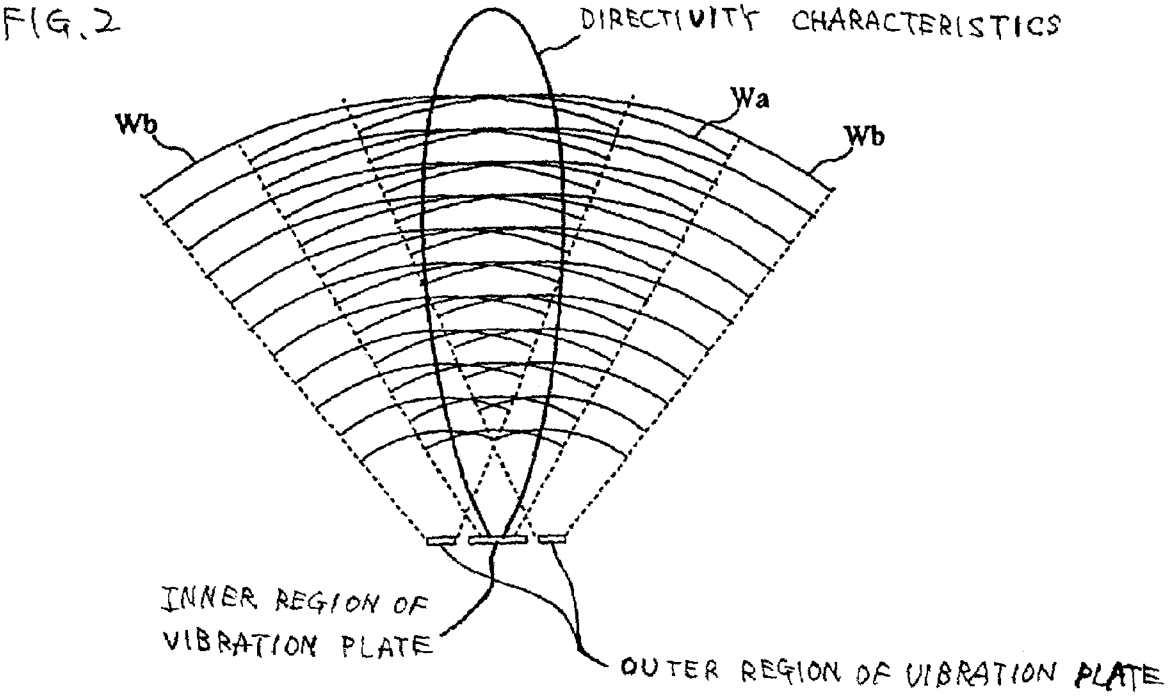
FIG. 2 is a diagram showing the appearance of interference among sound waves emitted from a vibration face of the ultrasonic vibration apparatus.

FIG. 2 shows the appearance of interference among sound waves occurring due to vibration of the inner region and the outer region of the above vibration plate with respect to a plane passing through a center axis perpendicular to the vibration plate. Here, Wa represents the density distribution of the sound waves due to vibration in the inner region of the vibration plate for each moment and Wb represents the density distribution of the sound waves due to vibration in the outer region thereof for each moment. Thus, when the sound waves Wa due to vibration in the inner region of the vibration plate interfere with the sound waves Wb due to vibration in both the right-side and left-side of the outer regions thereof, the sound pressure is maximized having such a direction that a pair of condensed regions of the sound waves overlaps and that a pair of rarified regions thereof overlaps. The sound pressure is minimized having such a direction that a condensed region thereof and a rarified region thereof overlap. This interference state is determined by the interval between the central part which is the antinode of vibration in the inner region of the vibration plate, and the outer peripheral portion which is the antinode of vibration in the outer region thereof; the wavelength of the generated ultrasonic waves; and the sound pressure of the ultrasonic waves generated in each part of the inner region and the outer region thereof. Therefore conditions are determined, as shown in this FIG. 2, for optimally interfering sound waves in the inner region of the vibration plate and sound waves in the outer region of the vibration plate such that great sound pressure is obtained in the forward direction which is perpendicular to the vibration plate and the sound pressure is weakened in a direction which deviates by a predetermined direction angle or greater from the front. Thus, desired narrow directivity characteristics are obtained.

Figure 3:
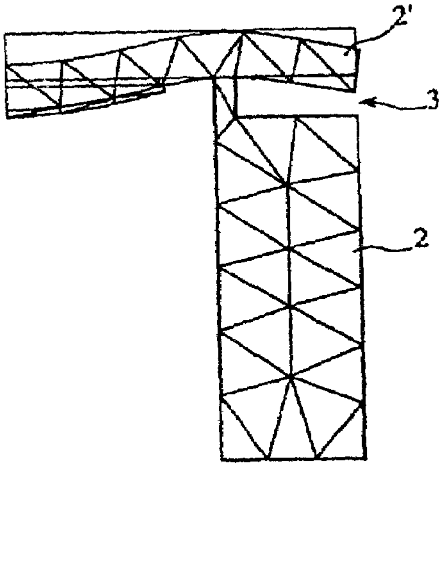
FIG. 3 is a diagram showing the appearance of deformation of a vibration plate thereof when vibrating.
Figure 4:
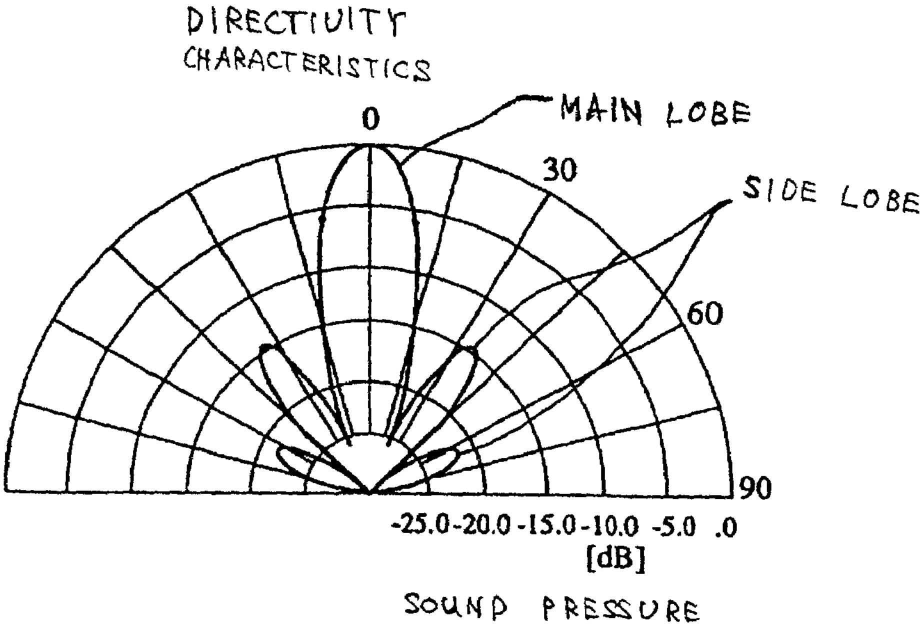
FIG. 4 is a diagram showing directivity characteristics thereof.
Figure 11:
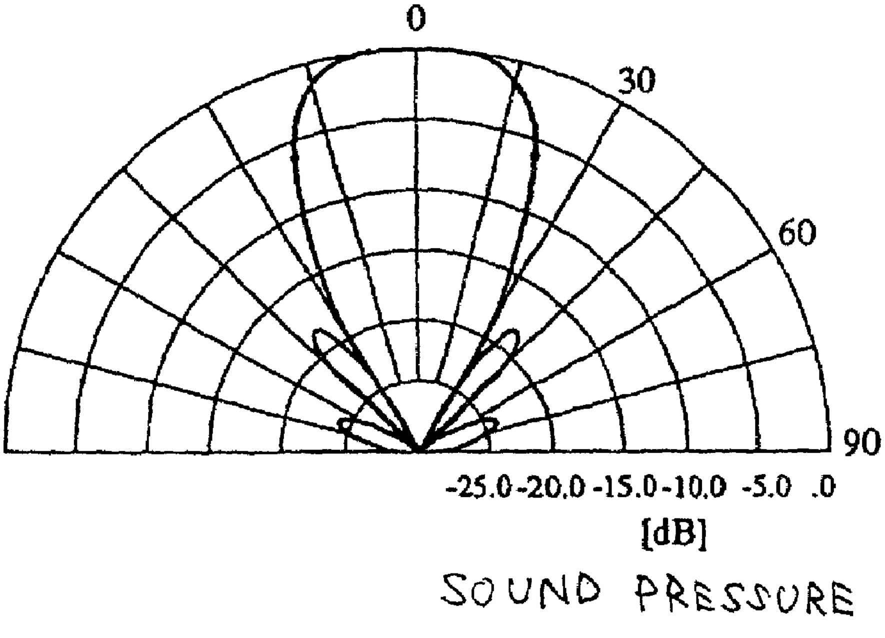
FIG. 11 is a diagram showing directivity characteristics thereof.

FIG. 3 shows the result of computation using a finite-element method (FEM) which is applied to the appearance of deformation of the vibration plate due to vibration of the ultrasonic vibration apparatus shown in FIGS. 1A to 1C. FIG. 4 shows the result determined by computing directivity characteristics of the ultrasonic waves emitted due to the deformation. In this example, an angle required for decreasing the sound pressure up to −6.0 [dB], that is, an angle (directivity angle) required for having the sound pressure halved is 24 degrees, which is approximately half of 44 degrees shown as the conventional example in FIG. 11.

Because of interference among sound waves from the two vibrating sources (three when illustrated in the cross sectional view) including one in the inner region of the vibration plate and one in the outer region thereof, regions for intensifying the sound pressures to each other are generated in directions which are widely separated laterally from the front. They appear as relatively large side lobes. However, the extent of the interference is slight and the sound pressure is approximately −15.0 dB. Accordingly, they are substantially smaller than the main lobe at the front, which is insignificant.

In the ultrasonic vibration apparatus having the construction shown in FIGS. 1A to 1C, since the inner region of the disk-like vibration plate 2' vibrates primarily and the outer region thereof vibrates secondarily, after a burst signal for driving this ultrasonic vibration apparatus terminates, the outer region continues to vibrate. Accordingly, there is a risk in which reverberation characteristics degrade compared to a construction having no provision of the outer region. In order to solve this, the width of the supporting unit 4 should be increased. However, since Q and the coupling coefficient of the ultrasonic vibration apparatus decreases, there is a risk that basic characteristics, other than reverberation characteristics, such as sound pressure, sensitivity, and directivity may be deteriorated.

Accordingly, the construction of an ultrasonic vibration apparatus according to a second embodiment which solves the foregoing problem is described with reference to FIGS. 5 to 8.

Figure 5A:
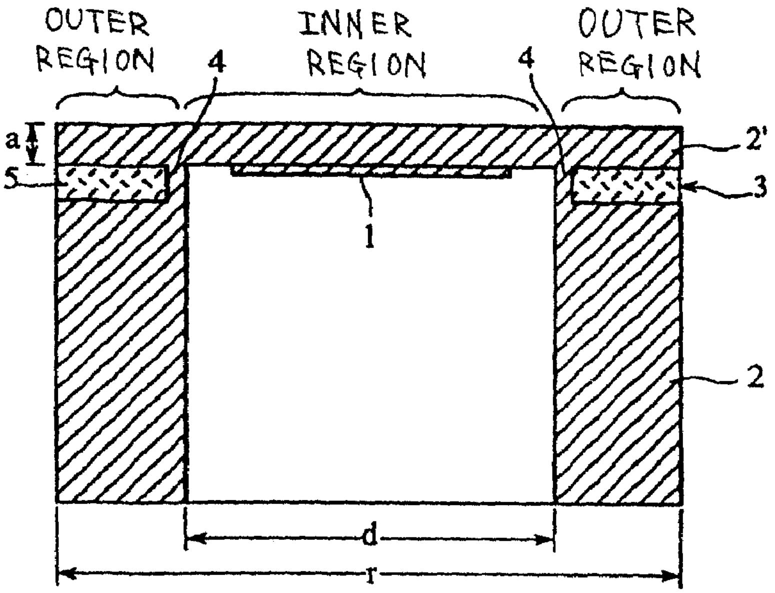
FIGS. 5A, 5B, and 5C are diagrams showing the construction of an ultrasonic vibration apparatus according to a second embodiment.
Figure 5B:
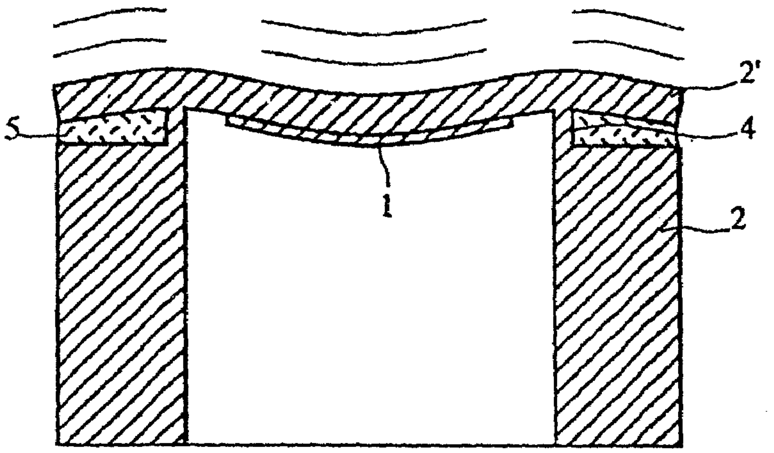
Figure 5C:
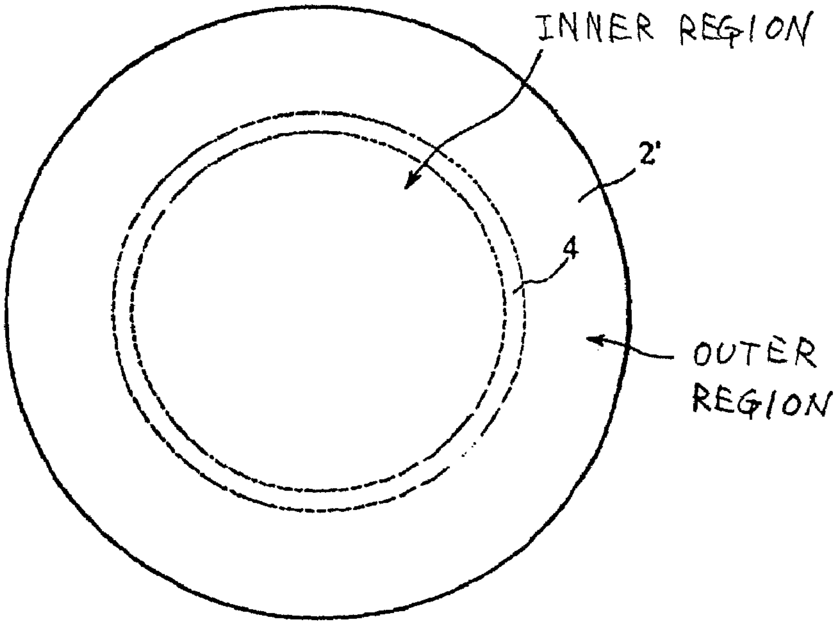

FIGS. 5A to 5C are cross sectional and top plan views showing the construction of the ultrasonic vibration apparatus. It differs from the ultrasonic vibration apparatus shown in FIGS. 1A to 1C in that filler 5 is filled in the groove 3. As this filler 5, flexible filling material having a hardness lower than that of the casing 2 is used.

FIG. 5B shows a state in which the disk-like vibration plate 2' is deformed when vibrating due to piezoelectric vibration of the piezoelectric element 1. As a consequence of the bending vibration of the piezoelectric element 1, the disk-like vibration plate 2' bending-vibrates in which the supporting unit 4 thereof serves as a node of vibration and in which the central part of the inner region and the outer peripheral portion of the outer region serve as antinodes of vibration. At this time, the filler 5 causes vibration in the outer region to be damped. Therefore, after the burst signal for driving this ultrasonic vibration apparatus is finished, vibration in the outer region is rapidly damped. As a result, reverberation characteristics are effectively improved.

Figure 6A:
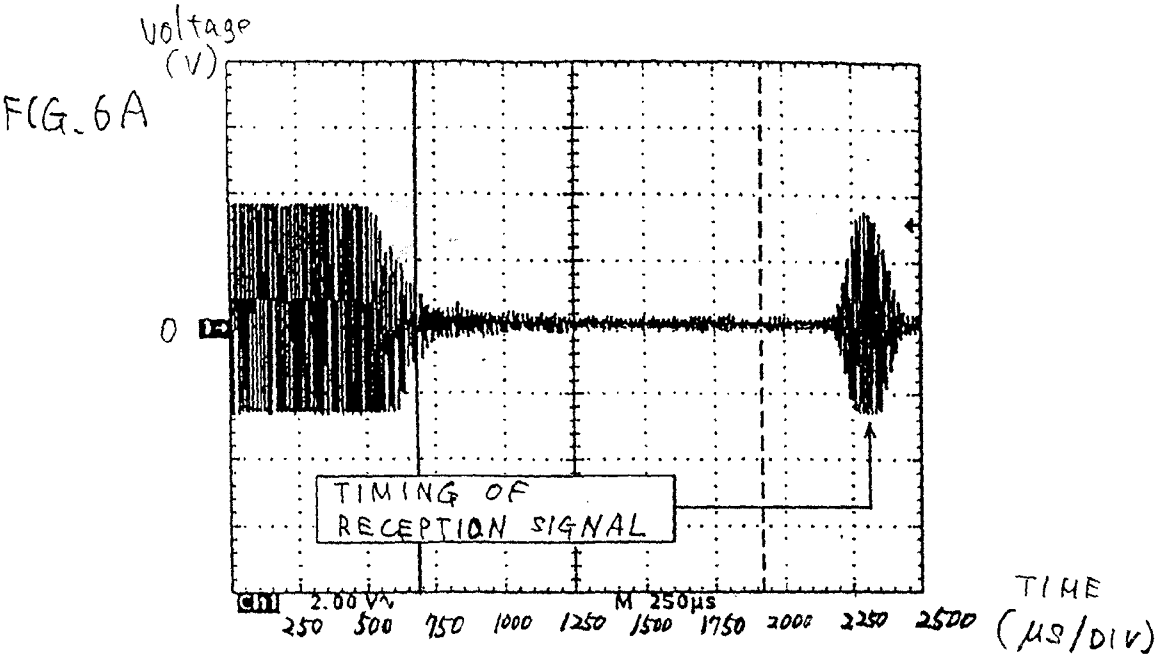
FIGS. 6A and 6B are diagrams showing example reverberation characteristics thereof.
Figure 6B:
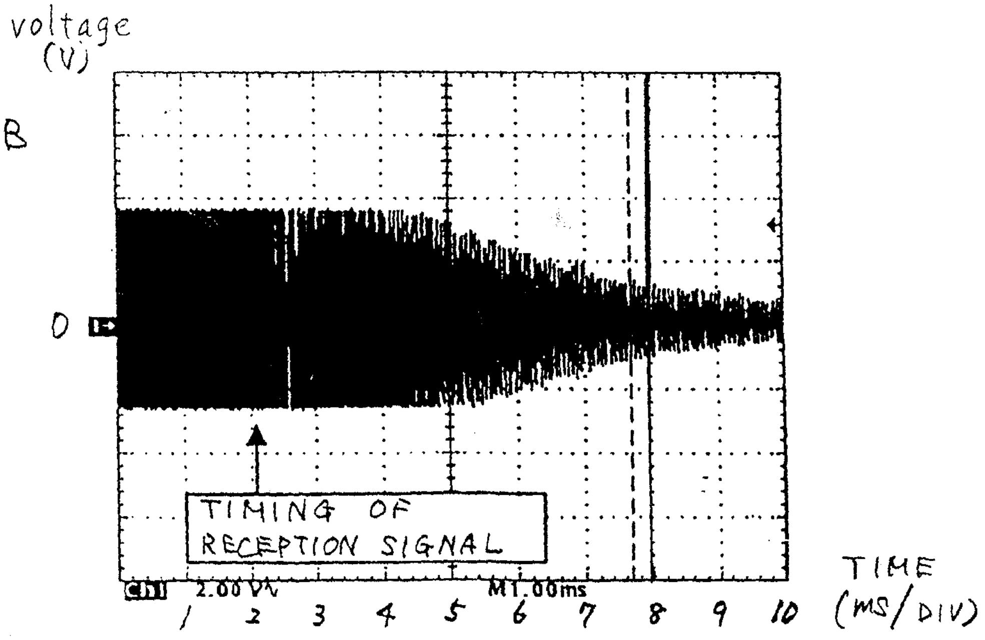
Figure 7:
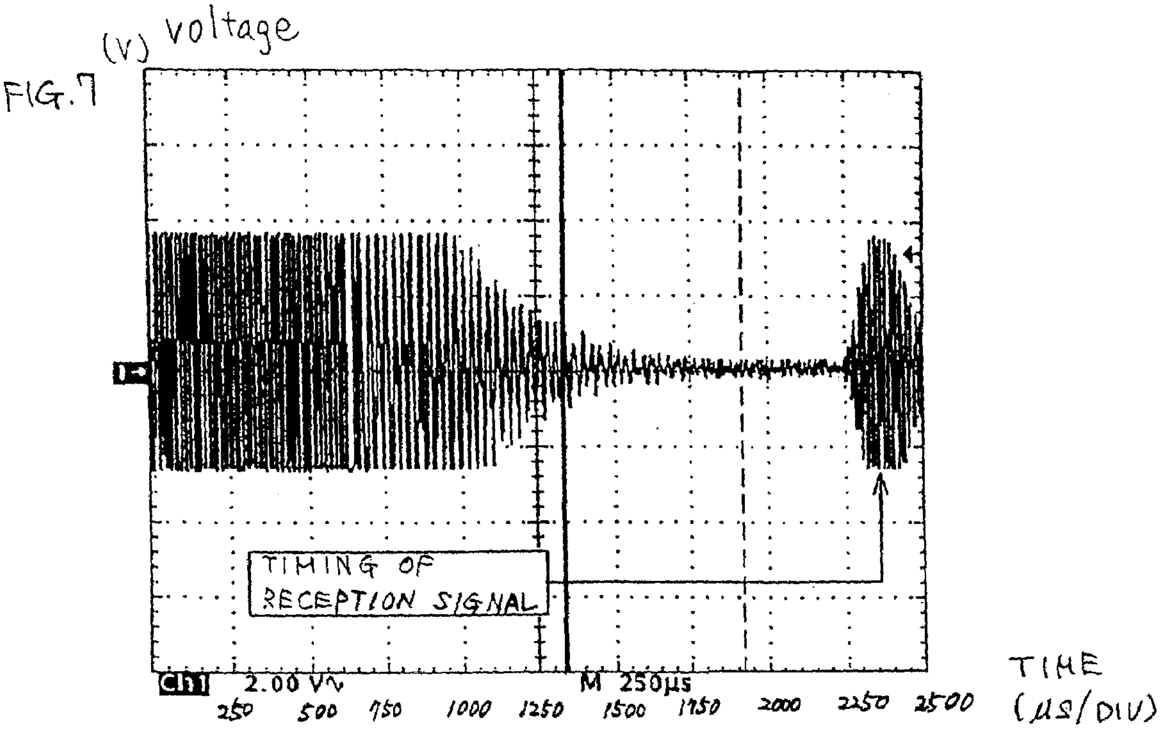
FIG. 7 is a diagram showing other example reverberation characteristics thereof.

Specifically, reverberation characteristics are shown in FIGS. 6 and 7 when the resonance frequency is 60 kHz, r=16 mm, d=9.4 mm, a=0.7 mm, the width of the supporting unit 4 is 0.5 mm, and the thickness of the piezoelectric element 1 is 0.15 mm. FIG. 6A shows characteristics in a case in which bonding silicone rubber having a hardness of 50 and an elongation of 130% according to JISA, which is the Japanese Industrial Standard for rubber resin, is filled in the groove 3. FIG. 6B shows characteristics in a case in which such filler is not filled therein. Here, when a period from the start timing of the burst signal, which is the driving signal, having a duration of 130 $\mu$s, to a time at which the received signal decreases below 1[V] is set as reverberation time t, in the example in FIG. 6B, t=8.0 ms, while a period from the start timing of the burst signal to a time at which voltage decreases below 1[V] in the example in FIG. 6A, i.e. duration of reverberation is t=700 $\mu$s, which is greatly decreased.

Figure 8:
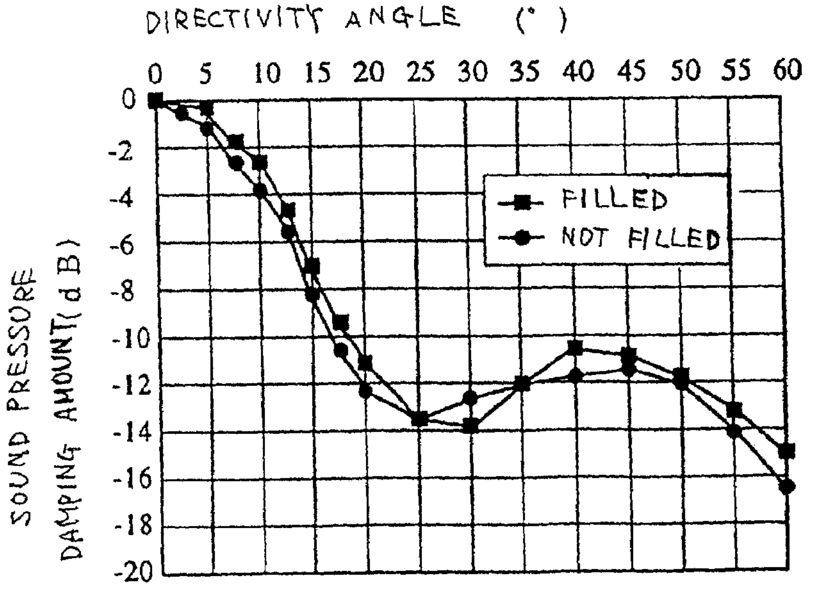
FIG. 8 is a diagram showing directivity characteristics thereof.
Figure 9A:
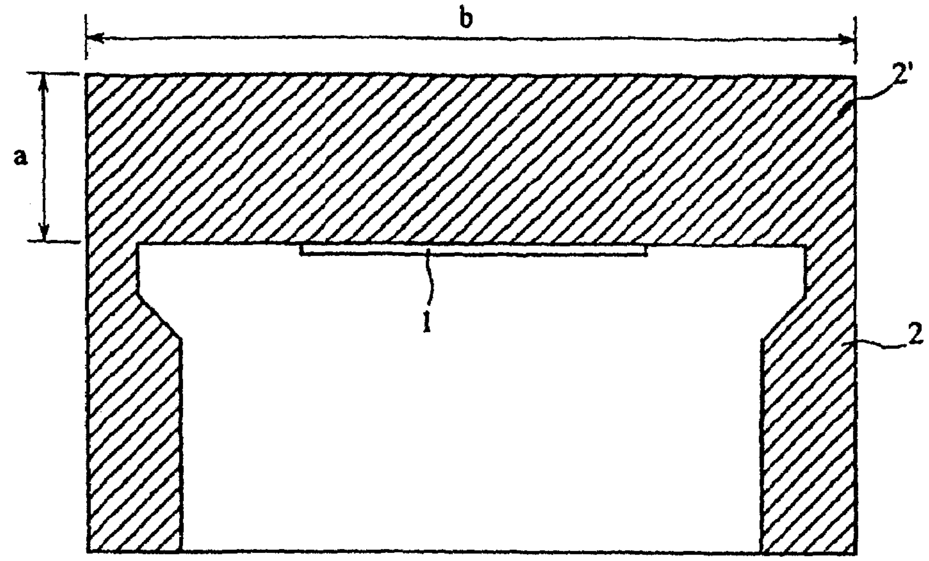
FIGS. 9A and 9B are diagrams showing the construction of a conventional ultrasonic vibration apparatus.
Figure 9B:
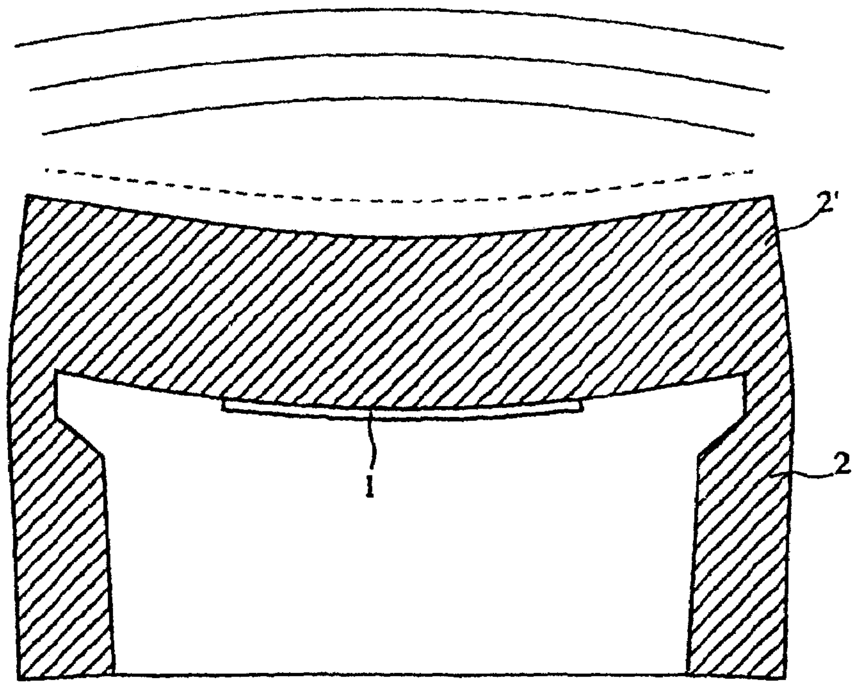
Figure 10:
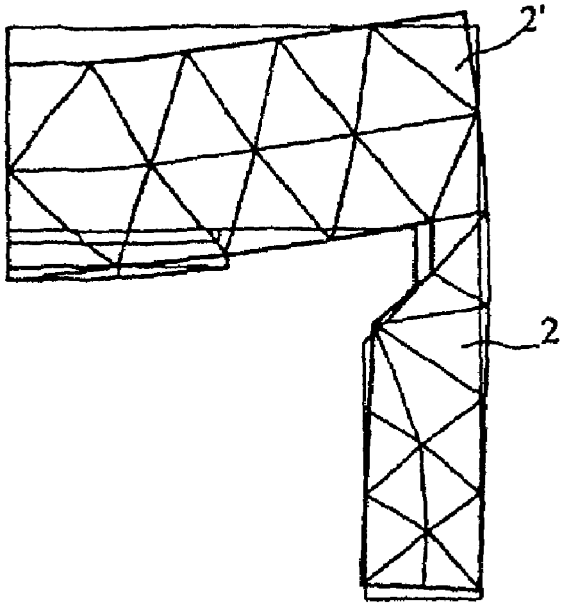
FIG. 10 is a diagram showing the appearance of deformation of the vibration plate thereof when vibrating.

FIG. 8 shows directivity characteristics of the above two ultrasonic vibration apparatuses. Thus, the tendency of the sound pressure to drop in which the sound pressure is varied in accordance with deviation of the directivity angle from 0 degree becomes gradual due to filling of the above filler. Therefore, the angle (directivity angle) required for having the sound pressure halved is wider. However, in this example, the widened angle is small.

FIG. 7 is a diagram showing reverberation characteristics in which flexible filling material having a hardness of 20 and an elongation of 300 is filled in the groove 3. Thus, by softening the filler more than in a case shown in FIG. 6A, the reverberation time t becomes as long as 1340 $\mu$s in this example. Instead, the narrow directivity effect due to vibration in the above outer region is enhanced and the directivity angle is improved compared to a case shown in FIG. 8.

Thus, by appropriately selecting the hardness and the elongation of the filler, both reverberation characteristics and directivity characteristics can be determined to optimal values within a predetermined specified range.

What is claimed is:

1. An ultrasonic vibration apparatus, comprising:

a disk like vibration plate having a circular vibration surface, said vibration surface having an outer periphery;

a support member coupled to said disk like vibration plate along a circular path located inside said outer periphery of said circular vibration surface so as to divide said vibration surface into inner and outer regions;

a base member for the support member forming a chamber the disk-like vibration plate closing off one end of the chamber, the chamber being open at an opposite end, and a piezoelectric element coupled to a central region of said disk-like vibration plate inside the chamber to cause said inner and outer regions to vibrate in a resonance mode such that the inner and outer regions vibrate in substantially the same phase.

2. An ultrasonic vibration apparatus according to claim 1, wherein said circular path defines an amplitude vibration node of said vibration plate.

3. An ultrasonic vibration apparatus according to claim 2, wherein said support member has a hollow cylindrical shape.

4. An ultrasonic vibration apparatus according to claim 3, wherein said support member is coupled to a cylindrical base member having an outer periphery which lies outside of said circular path.

5. An ultrasonic vibration apparatus according to claim 4, wherein said cylindrical base member has a hollow cylindrical shape with a wall thickness that is greater than the wall thickness of said support member.

6. An ultrasonic vibration apparatus according to claim 4, wherein a groove is defined by said base member, said support member and said vibration plate and wherein a vibration damping member is located in said groove.

7. An ultrasonic vibration apparatus according to claim 6, wherein said vibration damping member is formed of a flexible material.

8. An ultrasonic vibration apparatus according to claim 6, wherein said vibration damping member is formed of a softer material than said vibration plate.

9. An ultrasonic vibration apparatus according to claim 4, wherein said vibration plate, said support member and said cylindrical base member are integral with one another.

10. An ultrasonic vibration apparatus according to claim 4, wherein said vibration plate, said support member and said cylindrical base member together define a cylindrical casing closed at one end by said vibration plate.

11. An ultrasonic vibration apparatus according to claim 1, wherein said vibration surface is a flat, planar surface and said inner and outer regions lie in the same plane.

12. An ultrasonic vibration apparatus according to claim 1, further including a groove located directly below said outer region and a vibration damping member located in said groove.

13. An ultrasonic vibration apparatus according to claim 12, wherein said vibration damping member is formed of a flexible material.

14. An ultrasonic vibration apparatus according to claim 12, wherein said vibration damping member is a material which is softer than the material of said disk like vibration plate.

15. An ultrasonic vibration apparatus, comprising:

a disk-like vibration plate having a circular vibration surface, said vibration surface having an outer periphery;

a support member coupled to said disk-like vibration plate along a circular path located inside said outer periphery of said circular vibration surface so as to divide said vibration surface into inner and outer regions; and a piezoelectric element coupled to a central region of said disk-like vibration plate inside the chamber to cause said inner and outer regions to vibrate in a resonance mode such that the inner and outer regions vibrate in substantially the same phase;

further comprising a cylindrical base member on which the support member is disposed, the support member and base member being disposed on the same side of the vibration plate, the disk-like vibration plate closing off one end of the chamber, the chamber being open at an opposite end.

16. An ultrasonic vibration apparatus, comprising:

a disk-like vibration plate having a circular vibration surface, said vibration surface having an outer periphery;

a support member coupled to said disk-like vibration plate along a circular path located inside said outer periphery of said circular vibration surface so as to divide said vibration surface into inner and outer regions; and a piezoelectric element coupled to a central region of said disk-like vibration plate to cause said inner and outer regions to vibrate in a resonance mode such that the inner and outer regions vibrate in substantially the same phase;

a base member for said support member;

further wherein the vibration plate is free from support in said outer region;

further wherein said disk-like vibration plate, support member and base member are of integral construction.

* * * * *